(12) United States Patent
Ogasawara et al.

(10) Patent No.: US 6,172,364 B1
(45) Date of Patent: Jan. 9, 2001

(54) CHARGED PARTICLE BEAM IRRADIATION APPARATUS

(75) Inventors: Munehiro Ogasawara, Fujisawa; Jun Takamatsu, Asaka; Naoharu Shimomura, Tokyo; Shusuke Yoshitake, Yokohama; Takayuki Abe, Kawasaki; Masamitsu Itoh, Yokohama, all of (JP)

(73) Assignee: Kabushiki Kaisha Toshiba, Kawasaki (JP)

(*) Notice: Under 35 U.S.C. 154(b), the term of this patent shall be extended for 0 days.

(21) Appl. No.: 09/118,924

(22) Filed: Jul. 20, 1998

(30) Foreign Application Priority Data

Jul. 29, 1997 (JP) .................................... 9-203004

(51) Int. Cl.[7] .................................... H01J 37/26
(52) U.S. Cl. ................. 250/310; 250/398; 250/505.1; 250/515.1
(58) Field of Search ................... 250/310, 398, 250/505.1, 515.1

(56) References Cited

U.S. PATENT DOCUMENTS

| | | | | |
|---|---|---|---|---|
| 4,288,697 | * | 9/1981 | Albert | 250/505.1 |
| 4,493,097 | * | 1/1985 | Clayton | 250/398 |
| 4,845,402 | * | 7/1989 | Smith | 250/515.1 |
| 5,012,080 | * | 4/1991 | Griscom | 250/515.1 |
| 5,266,802 | * | 11/1993 | Kasai | 250/310 |
| 5,362,964 | * | 11/1994 | Knowles et al. | 250/310 |
| 5,569,920 | * | 10/1996 | Phang et al. | 250/310 |

OTHER PUBLICATIONS

K.K. Christenson, et al. "X–ray Mask Fogging by Electrons Backscattered Beneath the Membrane", J. Vac. Sci. Technol. B 8(6), Nov./Dec. 1990, pp. 1618–1623.

* cited by examiner

Primary Examiner—Bruce C. Anderson
(74) Attorney, Agent, or Firm—Oblon, Spivak, McClelland, Maier & Neustadt, P.C.

(57) ABSTRACT

A reflection prevention board of a charged particle beam irradiation apparatus of the present invention comprises a laminate sheet having a plurality of thin films and a plurality of microholes through the laminate sheet. According to the present invention the reflection prevention board can be manufactured at a lower cost, the reason being that it is easier to form microholes in the thin films and then laminate these thin films in an aligned relation than to drill holes through a thicker sheet. By doing so it is possible to achieve a better yield. Further, much deeper microholes, which might not otherwise be achieved on a thick sheet, can be formed by using more thin films and a reflection prevention effect can be improved by doing so.

15 Claims, 6 Drawing Sheets

CHARGED PARTICLE BEAM IRRADIATION APPARATUS

BACKGROUND OF THE INVENTION

The present invention relates to a charged particle beam irradiation apparatus for use in the writing and measurement of a micropattern on a semiconductor device and, in particular, a charged particle beam irradiation apparatus having an improved reflection prevention board over a sample surface.

In the lithography process of the-state-of-the-art semiconductor manufacturing process, it is expected that an electronic beam writing type will become a future main-stream technique. The reason is that the electron beam writing method is outstandingly higher in image resolution than the light beam writing method.

The electronic beam writing apparatus is used for forming an etching mask on a sample for example. As shown in FIG. 1, an electron beam narrowly stopped down by an objective lens 61 is directed onto a resist 62 coated on a sample 63, such as a mask, a wafer, etc., and the resist 62 is scanned with the electron beam. A pattern is formed on the resist 62. And an etching mask is completed by doing so.

A portion of the electron beam thus directed for irradiation is reflected on the surface of the sample 63. Secondary electrons are produced from the sample 63. Some of the reflected electrons and secondary electrons 73 are reflected on the lower surface of the objective lens 61 and back onto the resist 62, resulting in an error occurring on the resist 62. Those reflected and secondary electrons 74 returned back onto the resist 62 are light-sensitized at other than a target location, resulting in a lowering in writing precision. In order to reduce such an error, a reflection prevention board is attached to the lower surface of the objective lens 61, the sheet being made of a material of a lower atomic number, such as a carbon.

As a demand for a write precision becomes higher and higher, no adequate reflection preventing effect is obtained from the reflection prevention board made of the lower atomic number material. In order to improve the reflection prevention effect, proposals are made to provide a reflection prevention board with microholes opened perpendicular to the sheet. Further, as shown in FIG. 2, a proposal is also made to provide a honeycomb type reflection prevention board with a dense array of hexagonally prismatic microholes.

However, the proposed reflection prevention board has the following problems (1) and (2):

(1) The deeper the microholes in the reflection prevention board, that is, the thicker the reflection prevention board, the higher the reflection prevention effect. In general, with the microhole diameter set to 0.8 mm, at least 4 mm-thick sheet is preferable as the reflection prevention board. It is difficult, however, to form a regular honeycomb array of microholes in such a thick metal sheet by the mechanical working technique. And more working time is taken and, in spite of this, a poor yield and a very high manufacturing cost result. A proposal is also made to use the technique for metal-plating those holes in a thick-film resist patterned by an LIGA process, that is, the X-ray lithography. The LIGA process involves the problem of the reflection prevention board involving an upper size limitation and very high manufacturing cost.

(2) The conventional reflection prevention board can effectively prevent those vertically incident reflection electrons and secondary electrons. As shown, for example, in FIG. 3, it is not possible to effectively prevent those obliquely incident reflection electrons and secondary electrons. The reason is that the obliquely incident reflection electrons are reflected on the sidewall of the microhole and bounced out of the microhole.

As seen from the above, the existing reflection prevention board used in the electron beam writing apparatus presents the problems of being high in manufacturing cost, being unable to provide deeper microholes and being unable to effectively preventing the obliquely incident reflection electrons and secondary electrons.

BRIEF SUMMARY OF THE INVENTION

It is accordingly the object of the present invention to provide a charged particle beam irradiation apparatus which can prevent re-reflection of reflected particles/secondary particles at a lower manufacturing cost.

Another object of the present invention is to provide a charged particle beam irradiation apparatus which can effectively prevent re-reflection of reflected particles/secondary particles obliquely incident to a reflection prevention board.

A reflection prevention board of a charged particle beam irradiation apparatus of the present invention is comprised of a laminate sheet of thin films and a plurality of microholes formed therein. According to the present invention, the reflection prevention board can be manufactured at a lower cost. The reason is that it is very easier to form microholes in the thin films and then laminate these thin films in an aligned sheet than to form microholes in a thick board. By doing so, it is possible to improve a yield. Further, much deeper microholes, which might not otherwise be achieved on a thick board, can be formed by using more thin films.

In the charged particle beam irradiation apparatus of the present invention, a reflection prevention board is so formed as to have a plurality of inclined microholes therein. In this case, reflected particles and/or secondary particles obliquely incident to the reflection prevention board goes more deeply into the microholes so that a reflection prevention effect is improved.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

The preferred embodiments of the present invention will be explained below with reference to the accompanying drawing.

First Embodiment

Figure 1:
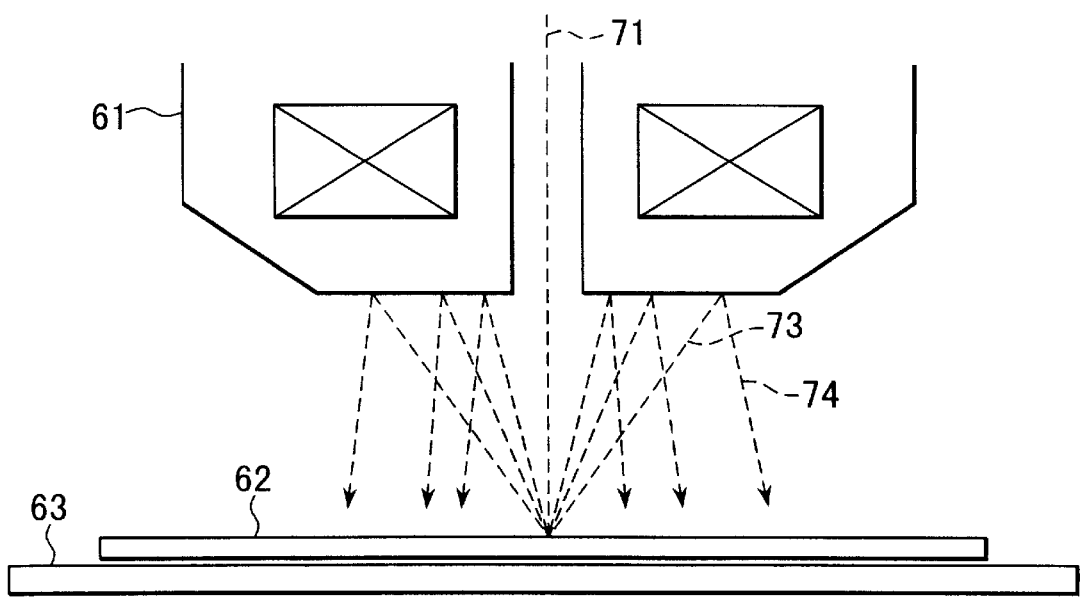
FIG. 1 is a view showing a write error conventionally occurring due to electrons which are reflected from a sample irradiated with an electron beam and/or secondary electrons emitted at that time being re-reflected back onto a resist.
Figure 2:
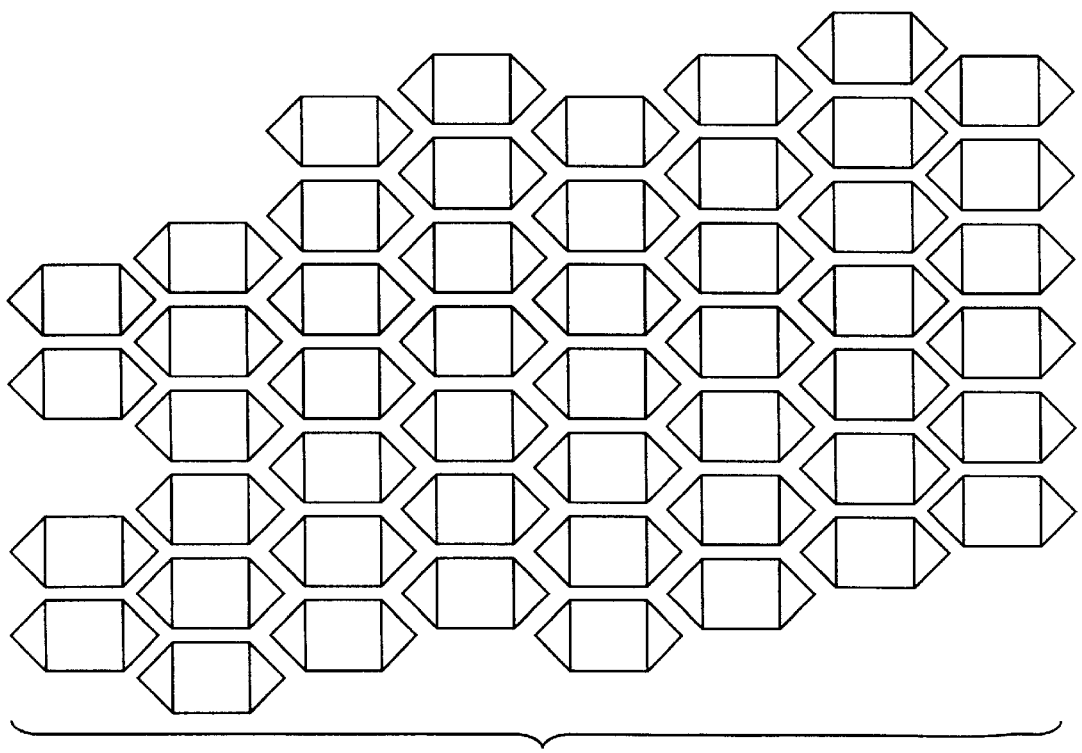
FIG. 2 is a plan view showing a reflection prevention board of a conventional honeycomb type.
Figure 3:
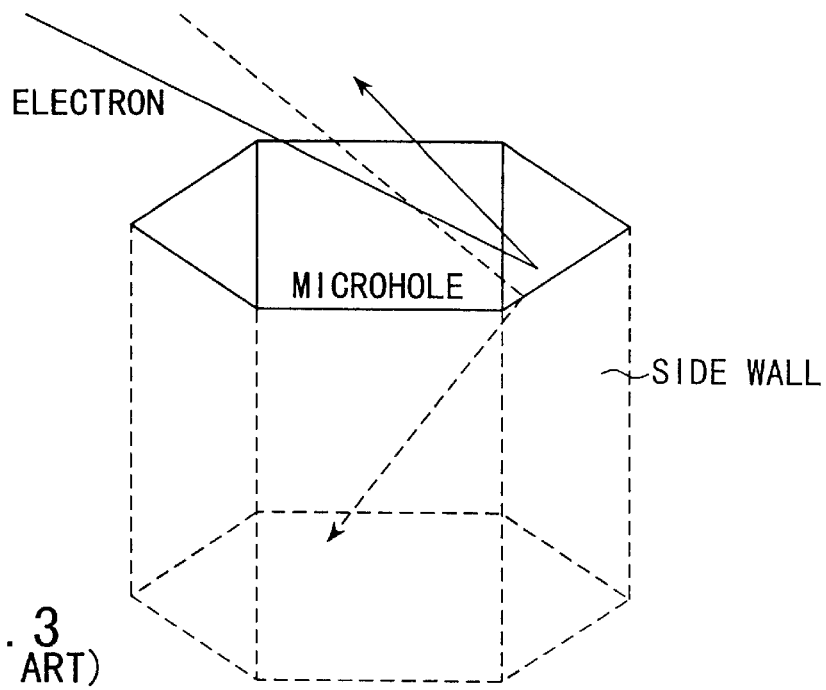
FIG. 3 is an explanatory view showing a problem with a conventional reflection prevention board.
Figure 4:
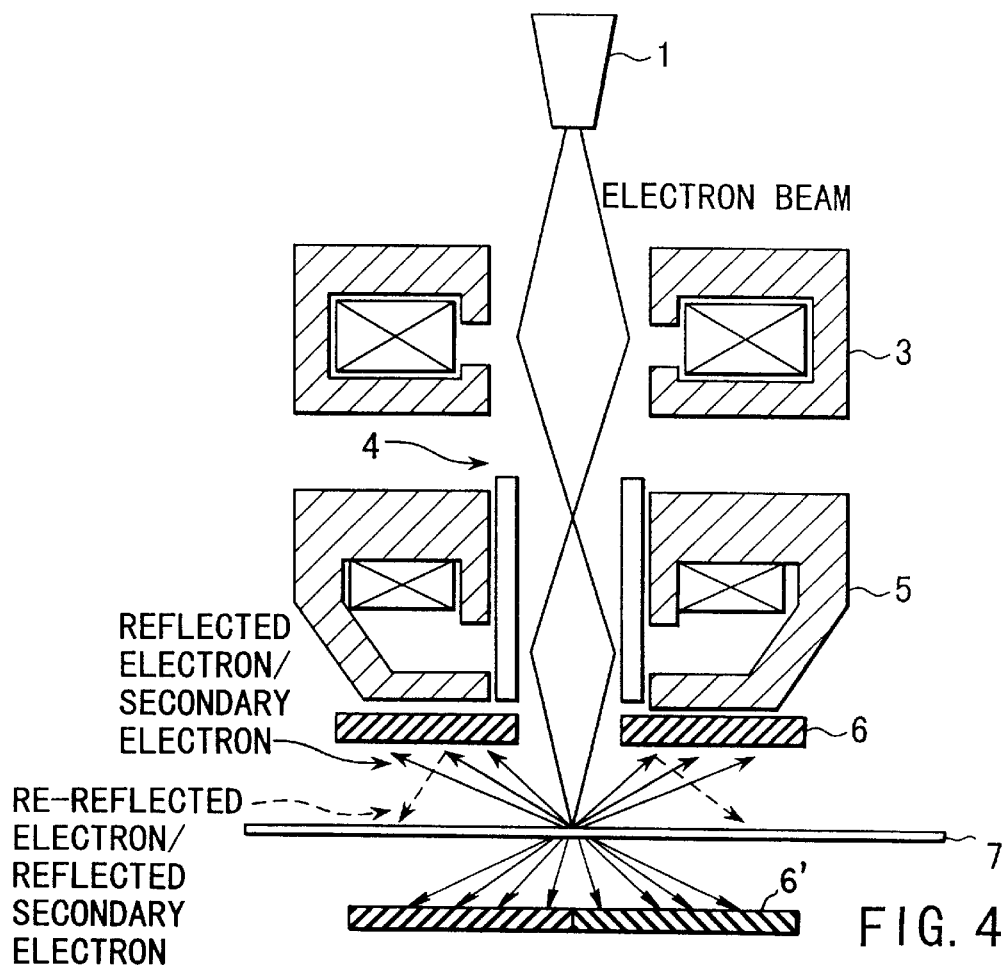
FIG. 4 is a structural view showing a charged beam irradiation apparatus according to a first embodiment of the present invention.

As shown in FIG. 4, an electronic beam writing apparatus of the present invention includes an electron gun 1 for generating an electron beam, a condenser lens 3 for focusing the electron beam, a deflector 4 for deflecting the electron beam, an objective lens 5 for focusing the beam onto a sample 7, and a reflection prevention board 6 provided on the lower surface side of the objective lens 5, that is, on a side opposite to the sample 7.

The reflection prevention board 6 is provided to prevent some of the electrons which are directed onto the sample 7 and reflected on the surface of the sample, and/or those secondary electrons which are knocked out from the sample, from being re-reflected back onto the sample 7 for irradiation.

Figure 5:
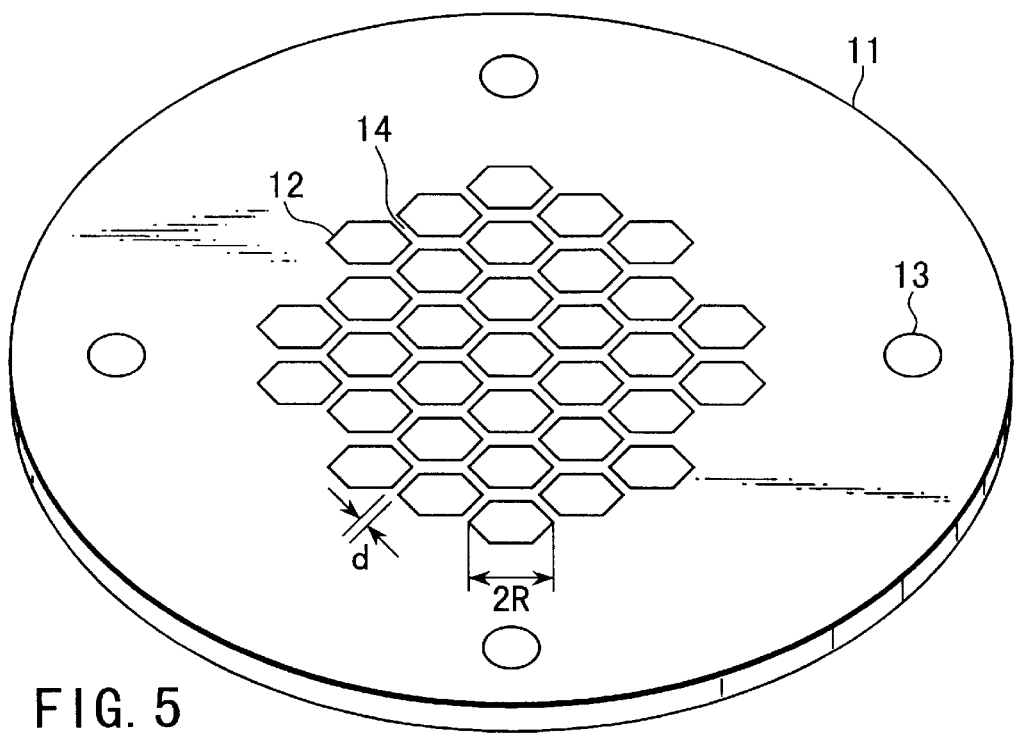
FIG. 5 is a perspective view showing a thin film for a reflection prevention board of FIG. 4.
Figure 6:
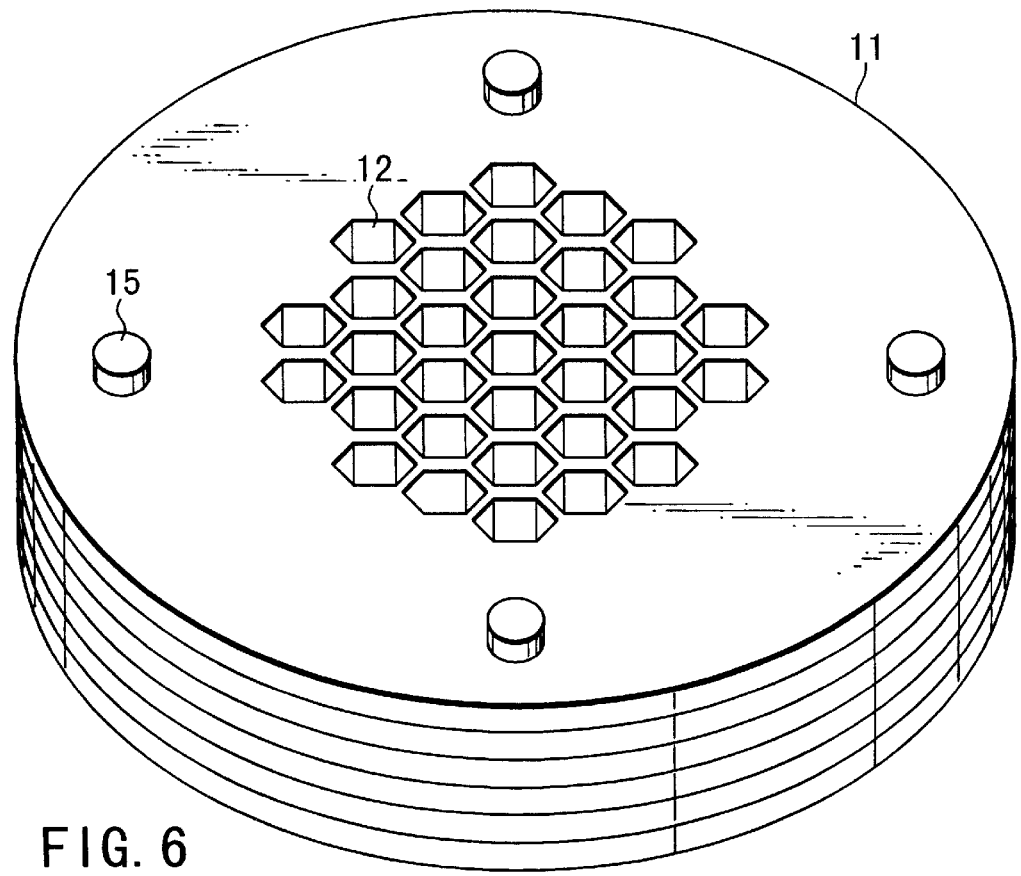
FIG. 6 is a perspective view showing a laminate sheet of which a reflection prevention board of FIG. 4 is comprised.

FIG. 5 shows one thin film and FIG. 6 shows a reflection prevention board 6 made up of a laminated thin film structure. The thin film 11 is formed with a honeycomb array of hexagonally prismatic microholes 12 and has positioning holes 13 at four places. The thin film is made of, for example, a copper sheet 0.2 mm thick and the diameter 2R of the microhole 12 is, for example, 0.8 mm and a width d of a beam 14 separating adjacent microholes 12 from each other is, for example, 0.1 mm. In this case, a hole ratio of all the microholes 12 to the surface area of the thin film 11 reaches about 75%. By further decreasing the width d of the beam 14 it is possible to increase the hole ratio. Since the sheet 11 is thin, microholes can be easily formed by mechanical punching or chemical etching.

For example, 20 films 11 are, as shown in FIG. 6, laminated, are jointed by a pin 15. Needless to say, the microholes 12 are aligned in the thickness direction to pass through the board 6 and give a depth of 4 mm each. In this case the aspect ratio is 5 (=4 mm/0.8 mm). According to the experiments conducted by the present inventors, the reflectance was below 1% for an electron of 30 KeV in the case where it is incident to the center of the microhole whose bottom is aluminum and was smaller by above one order of magnitude in comparison with a Be flat sheet. In the present system, it is possible to readily obtain a higher aspect ratio by preparing many more thin films of the same structure.

According to the present invention, a plurality of thin films 11 with microholes 12 formed are joined in a positionally aligned relation to provide a reflection prevention board 6 with a high aspect ratio, that is, very deep microholes 12. The deep microholes 12 can effectively suppress the re-reflected electrons and knocked-out secondary electrons. In this case, no deep etching is necessary for the formation of deep microholes and it is only necessary to perform a simpler working process of opening microholes 12 in the thin film. It is, therefore, possible to manufacture the reflection prevention board at a much lower manufacturing cost.

It is to be noted that the reflection prevention board 6 may be formed with more kinds of thin film materials, instead of one kind of thin film material. For example, a reflection prevention board 6 may be made up of a laminated structure of Al, Au and Cu thin films. Further, another combination may be possible, such as a combination type of a low rigid material allowing the better absorption of reflected electrons and/or secondary electrons and a high rigid material but allowing the lower absorption of reflected electrons and/or secondary electrons. In this case, it is possible to get both the readier handling of it and an improved reflection prevention effect.

Second Embodiment

Figure 7:
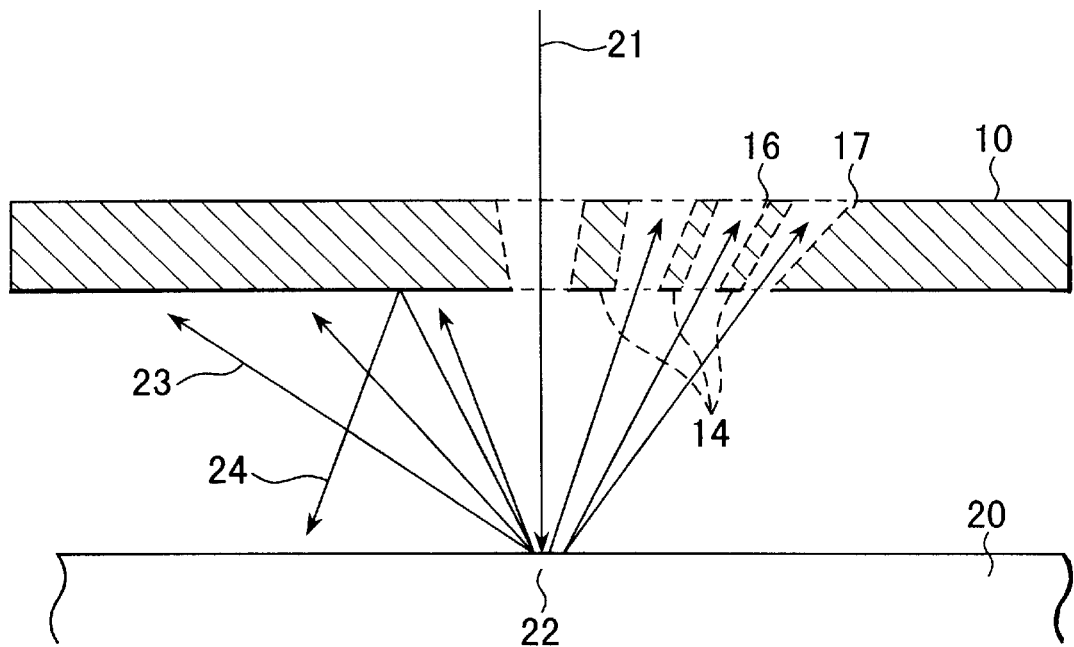
FIG. 7 is a cross-sectional view showing a reflection prevention board according to a second embodiment of the present invention.

FIG. 7 is a cross-sectional view for explaining a reflection prevention board of an electron beam writing apparatus according to a second embodiment of the present invention.

In this structure, a reflection preventing plate is of a single layer structure, not of a multi-layered structure as in the first embodiment, where a specific design consideration is given to the configuration of its microholes. That is, the reflection prevention board 10 is relatively thick, for example, 4 mm and has a plurality of microholes 16. The microholes 16 are inclined with respect to the reflection prevention board 10. Stated in more detail, the center axes of the microholes 16 is converged at an electron beam incident spot 22 and the oblique angles of the microholes vary from place to place.

In such an arrangement, reflected electrons and/or secondary electrons 24 penetrate deeply through the microholes without collision on the sidewall of these microholes, thus there being less chance of these electrons being re-reflected back from the sidewall of these microholes. Therefore, it is possible to improve a reflection prevention effect on the reflection prevention board 10 and ensure an improved write precision on the electron beam writing apparatus.

Here, ideally, as shown in FIG. 7, the microhole 16 is so formed as to have a hexagonally pyramidal configuration with its diameter shorter on the sample 20 side and greater on its base side, the microhole being gradually widened in a direction away from the incident spot 16 on the sample. Needless to say, the microhole 16 may be of a truncated conical configuration or truncated polygonally pyramidal configuration type. Forming the microhole 16 in such a specific configuration allows the reflected electrons and/or secondary electrons 24 to penetrate deeply through the microholes 16 in the reflection prevention board 10 almost without collision on the sidewall surface of these microholes. As a result, these electrons have less possibility of being re-reflected from the sidewall of these microholes 16. It is evident that, even if the diameter of the microhole 16 does not depend from its depth, the reflection electron prevention effect is improved.

Third Embodiment

Figure 8:
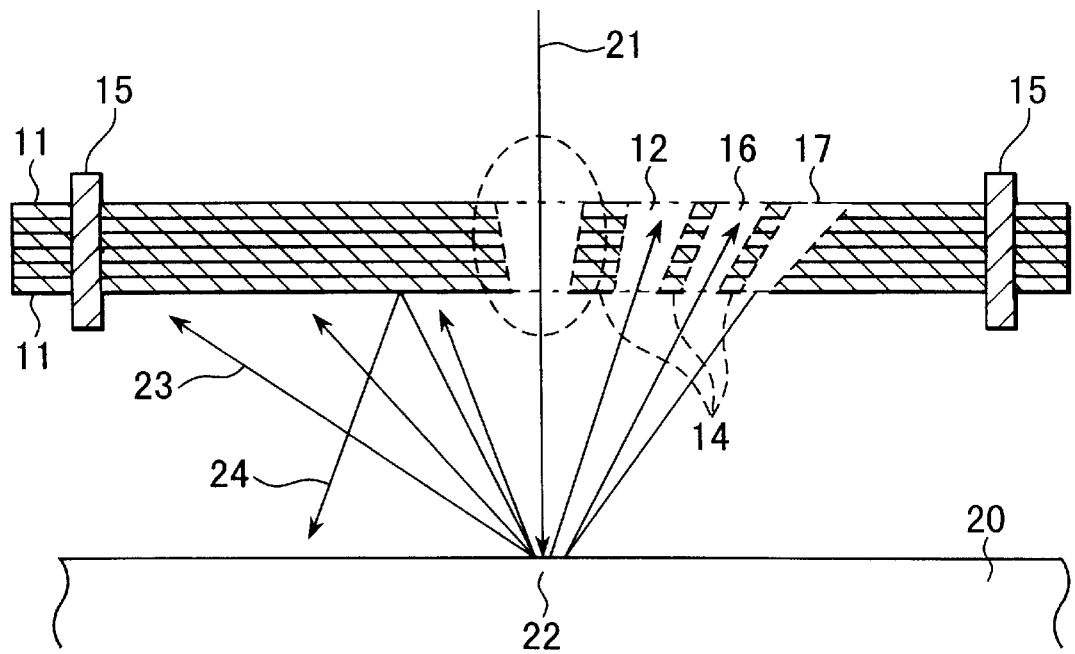
FIG. 8 is a cross-sectional view showing a reflection prevention board according to a third embodiment of the present invention.

FIG. 8 is a cross-sectional view for explaining a reflection prevention board of an electronic beam writing apparatus according to a third embodiment of the present invention.

This embodiment corresponds to first and second embodiments of the present invention. As in the first embodiment, microholes 12 are formed in a thin film 11 by etching and a plurality of such thin films are laminated one over another into a single layer structure. By gradually varying the diameter and position of each corresponding microhole 12 in the thin films 11, microholes 16 are so joined as to allow the central axes of the microholes 16 to converge at an electron beam incident position 22 as in the second embodiment, that is, to provide a truncated hexagonally conical configuration.

Figure 9:
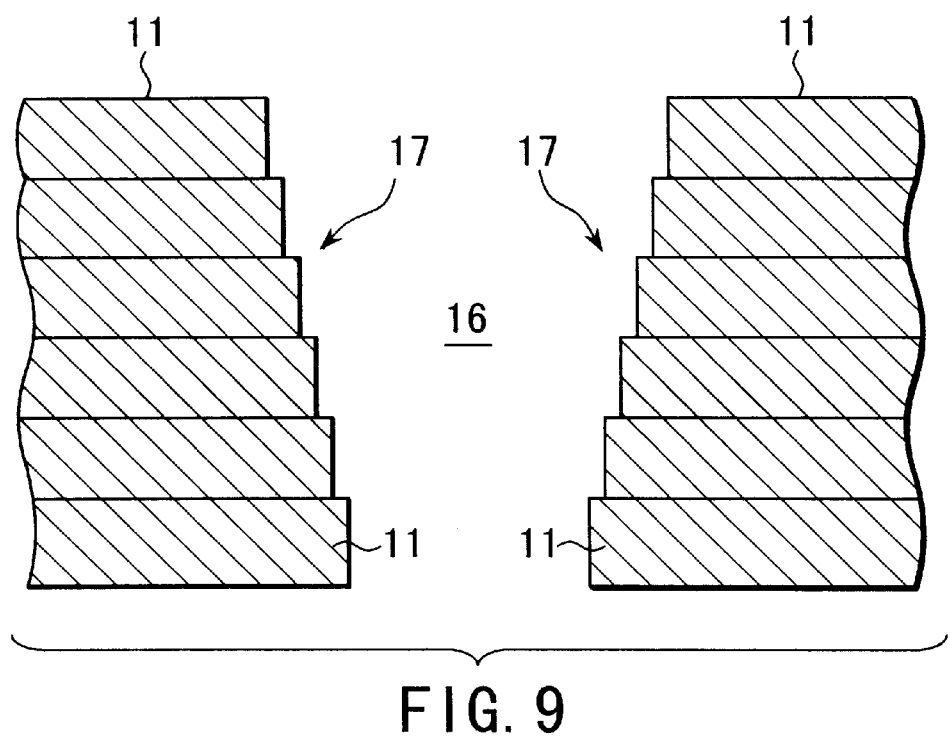
FIG. 9 is an enlarged view showing a dotted line area in FIG. 8.

FIG. 9 is an enlarged view of a portion as indicated by a dotted line in FIG. 8. When a reflection prevention plate is formed as set out above, a sidewall 17 of the microhole 16, is strictly speaking, stepped as shown in FIG. 9. If the thin films 11 are very thin each, a resultant fine stepped sidewall 17 has an advantage as a non-stepped sidewall, because the reflected/secondary electrons go deeper into the microholes without striking against the fine stepped sidewall 17. As a result, it is possible to further reduce the re-reflection from the microholes 16.

Figure 10:
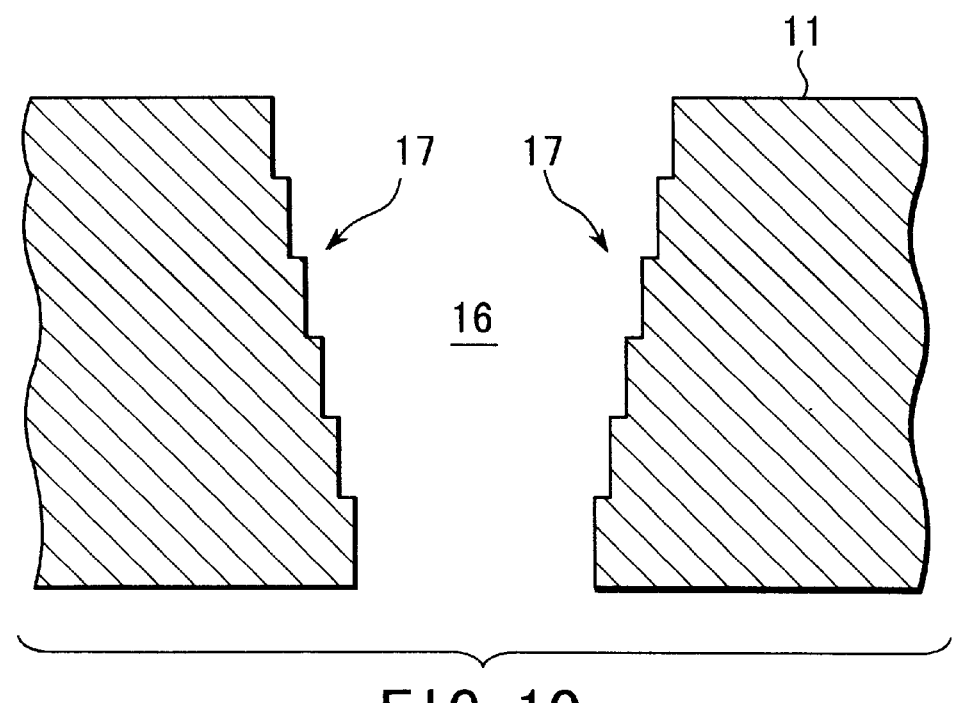
FIG. 10 is a partially cross-sectional view showing a reflection prevention board formed by a thermocompression bonding.

It is to be noted that the thin films, being jointed (integrated) by pins 15, may be adhesively bonded or thermocompression-bonded into an integral structure. If the thermocompression is done under the condition of a temperature lower than its melting point, a "solid-phase diffusion" phenomenon occurs and hence the atoms are mutually diffused between the adjacent thin films 11. As a result, it is not possible for a finished product to provide a multilayered structure or to identify any multilayered structure as shown in FIG. 10. Even in this case, the sidewall 17 of the microhole 16 is maintained as a stepped structure.

According to the present invention, it is possible to reduce the manufacturing cost of the reflection prevention board as in the first embodiment and to enhance the reflection prevention effect as in the second embodiment. Therefore, both the reduction of the cost and enhancement of the write precision can be accomplished simultaneously.

Fourth Embodiment

Figure 11:
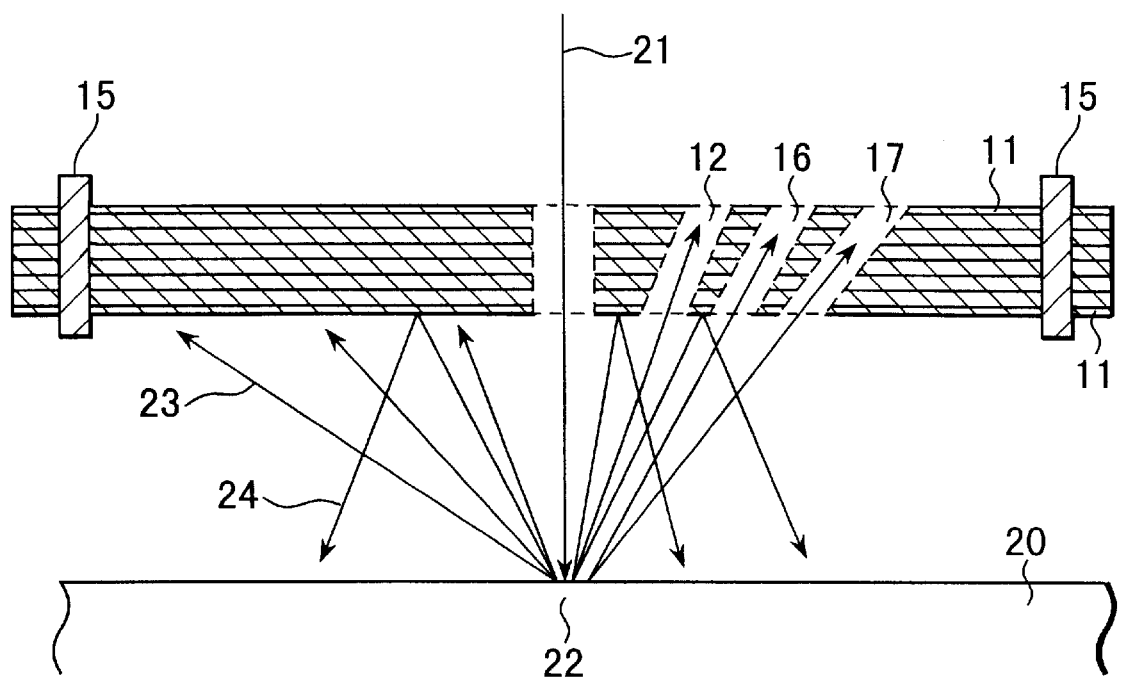
FIG. 11 is a cross-sectional view showing a reflection prevention board according to a fourth embodiment of the present invention.

FIG. 11 is a cross-sectional view for explaining a reflection prevention board of an electronic beam writing apparatus according to a fourth embodiment of the present invention.

This embodiment, though corresponding to a combination of the first and second embodiments, differs from the third embodiment in that microholes 12 in all thin films 11 are the same in size but differ in their position, that is, a joined microhole 16 becomes a truncated hexagonally prismatic configuration. Needless to say, the joined microhole 16 may take a truncated conical or truncated polygonally pyramidal configuration in accordance with the cross-section. In this case, this embodiment, though being somewhat inferior to the second and third embodiments, can ensure an adequate reflection prevention effect.

According to this embodiment, since the microholes 12 in the thin film 11 are all the same in size and different only in their position, they can be formed very easily. Further, the microholes 12 may be formed all vertical to a surface in which case the microholes 12 is more easily provided. That is, a reflection prevention board higher in reflection prevention efficiency than in the conventional counterpart can be easily manufactured at a lower cost.

The present invention is not restricted to the above-mentioned embodiments. The reflection prevention board thus explained in conjunction with the embodiments is effective to the apparatus using not only the electron but also an ion, a neutron and a photon beam. It is, therefore, possible to apply the present invention to not only the electron beam writing apparatus but also an ion beam writing apparatus. It is also possible to apply the present invention not only a charged particle beam writing apparatus but also a measuring apparatus using an electron beam microanalyzer, etc. The reflection prevention board 6' may be located under the sample 7. In this case, any secondary electrons radiated under the sample 7 can be prevented from being returned back to the sample 7.

Figure 12:
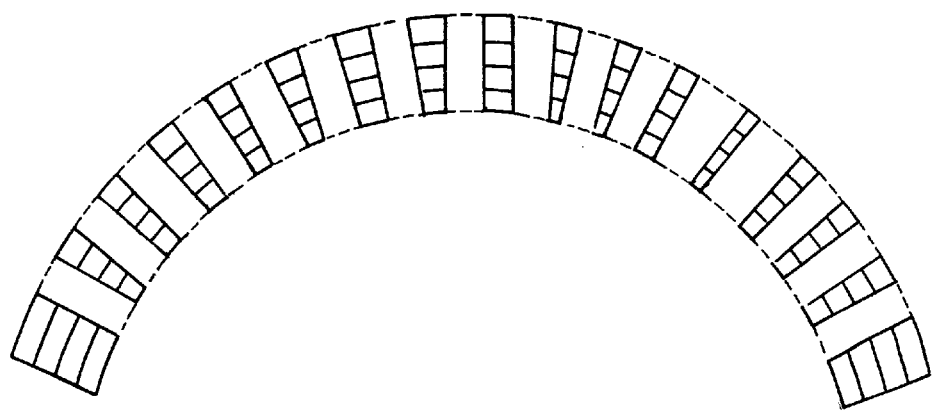
FIG. 12 is a cross-sectional view showing a reflection prevention board according to a variant of the present invention.

Further, since the thin film can be readily deformed by a pressing operation, etc., it is possible to form, as a reflection prevention structure, not only a flat one but also a curved one as shown in FIG. 12 and any proper combination of curved ones. If a thin film of a lower atomic number material, such as beryllium and carbon, is attached to a thin film surface or a surface of reflection prevention board comprised of thin films, then it has an effect of suppressing the reflectance at a remaining portion of that opening or at a sidewall of the microhole and it is effective to further improve the reflection particle prevention efficiency.

Further, the configuration and array of the microholes are not restricted to a honeycomb type and it may be considered that they are an array of, for example, rectangles and of concentric circles divided in an angular direction, and so on. Various changes or modifications can be made without departing from the spirit and scope of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A charged particle beam irradiation apparatus, comprising an irradiating device configured to irradiate a sample with a charged particle beam; and a reflection prevention board configured to prevent the sample from being re-irradiated with reflected particles and/or secondary particles, the reflection prevention board comprising a laminated sheet of a plurality of thin films and a plurality of microholes through the laminated sheet, the microholes being formed in an inclined relation to the reflection prevention board.

2. The charged particle beam irradiation apparatus according to claim 1, wherein the microholes are so arranged as to have their center axes converge.

3. The charged particle beam irradiation apparatus according to claim 1, wherein the microholes are so formed as to define a cylindrical or prismatic configuration each.

4. The charged particle beam irradiation apparatus according to claim 1, wherein the microholes are so formed as to define a truncated conical or a truncated pyramidal configuration each, are arranged as to have their center axes converge.

5. The charged particle beam irradiation apparatus according to claim 1, wherein the reflection prevention board is curved.

6. The charged particle beam irradiation apparatus according to claim 1, wherein the thin films are joined by a plurality of pins in an aligned relation.

7. The charged particle beam irradiation apparatus according to claim 1, wherein at least one of the plurality of thin films is made of a material different from that of the remaining thin film or sheets.

8. The charged particle beam irradiation apparatus according to claim 1, wherein the irradiating device has an electron gun for generating the charged particle beam and an objective lens for focusing the generated charged particle beam onto the sample, the reflection prevention board is arranged on a sample side of the objective lens and/or under the sample.

9. A charged particle beam irradiation apparatus comprising:

irradiating means for irradiating a sample with a charged particle beam; and a reflection prevention board having a plurality of microholes, for preventing the sample which is irradiated with the charged particle beam from being re-irradiated with reflected particles/secondary particles, these microholes being inclined with respect to the reflection prevention board.

10. The charged particle beam irradiation apparatus according to claim 9, wherein the microholes are so arranged as to have their center axes converge.

11. The charged particle beam irradiation apparatus according to claim 9, wherein the microholes are so formed as to define a cylindrical or a prismatic configuration each.

12. The charged particle beam irradiation apparatus according to claim 9, wherein the microholes are so formed as to define a truncated conical or a truncated pyramidal configuration each, the center axes of these truncated conical and pyramidal configurations being arranged in a converging relation.

13. The charged particle beam irradiation apparatus according to claim 9, wherein said reflection prevention board is curved.

14. The charged particle beam irradiation apparatus according to claim 9, wherein the irradiating means has an electron gun for generating the charged particle beam and an objective lens for focusing the generated charged particle beam onto the sample and the reflection prevention board is arranged on a sample side of the objective lens and/or under the sample.

15. A charged particle beam irradiation apparatus comprising:

irradiation means for irradiating a sample with a charged particle beam; and a reflection prevention board for preventing the sample from being re-irradiated with reflected particles and/or secondary particles, the reflection prevention board comprising a laminated sheet of a plurality of thin films in contact with each other and a plurality of microholes extending continuously through the laminated sheet.

* * * * *